(12) United States Patent
Scobee et al.

(10) Patent No.: US 11,658,175 B2
(45) Date of Patent: *May 23, 2023

(54) THERMAL CHAMBER FOR A THERMAL CONTROL COMPONENT

(71) Applicant: Micron Technology, Inc., Boise, ID (US)

(72) Inventors: Daniel G. Scobee, Ione, CA (US); Aleksandr Semenuk, Orangevale, CA (US); Aswin Thiruvengadam, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/459,589

(22) Filed: Aug. 27, 2021

(65) Prior Publication Data

US 2021/0391319 A1 Dec. 16, 2021

Related U.S. Application Data

(63) Continuation of application No. 16/218,038, filed on Dec. 12, 2018, now Pat. No. 11,121,125.

(51) Int. Cl.
*H01L 31/00* (2006.01)
*H01L 27/02* (2006.01)
(Continued)

(52) U.S. Cl.
CPC .......... *H01L 27/0248* (2013.01); *G01K 7/021* (2013.01); *G06F 1/20* (2013.01); *H01L 35/04* (2013.01); *H05K 1/0203* (2013.01)

(58) Field of Classification Search
CPC ... H01L 27/0248; H01L 35/04; H05K 1/0203; G01K 7/021; G06F 1/20
(Continued)

(56) References Cited

U.S. PATENT DOCUMENTS 4,782,291 A 11/1988 Blandin
4,796,155 A 1/1989 Saito et al.
(Continued)

FOREIGN PATENT DOCUMENTS

DE 102005008361 A1 9/2006
EP 1959262 A1 8/2008
(Continued)

OTHER PUBLICATIONS

International Search Report and Written Opinion dated Apr. 1, 2020, on application No. PCT/US2019/065495.
(Continued)

*Primary Examiner* — Davis D Hwu
(74) *Attorney, Agent, or Firm* — Lowenstein Sandler LLP

(57) ABSTRACT

A thermal chamber includes a cavity that is enclosed by sides and one or more ports that expose the cavity within the thermal chamber. Each of the one or more ports is configured to receive a temperature control component having a solid physical structure and configured to transfer thermal energy to and from an electrical device exposed via the cavity. The thermal chamber includes a bottom side open area of the thermal chamber located below the one or more ports. The bottom side open area is configured to allow the temperature control component to contact the electrical device that is exposed via the bottom side open area.

20 Claims, 10 Drawing Sheets

(51) Int. Cl.
  *H01L 35/04* (2006.01)
  *H05K 1/02* (2006.01)
  *G01K 7/02* (2021.01)
  *G06F 1/20* (2006.01)

(58) Field of Classification Search
  USPC .......................................................... 257/467
  See application file for complete search history.

(56) References Cited

U.S. PATENT DOCUMENTS

| | | | |
|---|---|---|---|
| 5,390,077 | A | 2/1995 | Paterson |
| 5,936,192 | A | 8/1999 | Tauchi |
| 6,064,572 | A | 5/2000 | Remsburg |
| 6,820,684 | B1 | 11/2004 | Chu |
| 11,121,125 | B2 * | 9/2021 | Scobee ............... H01L 23/4093 |
| 2001/0052234 | A1 | 12/2001 | Venkatasubramanian |
| 2002/0124573 | A1 | 9/2002 | Evans et al. |
| 2005/0045702 | A1 | 3/2005 | Freeman et al. |
| 2006/0113690 | A1 | 6/2006 | Huddart |
| 2008/0178920 | A1 | 7/2008 | Ullo |
| 2008/0184710 | A1 | 8/2008 | DeVilbiss |
| 2009/0009204 | A1 | 1/2009 | Lee et al. |
| 2010/0053868 | A1 | 3/2010 | Yang et al. |
| 2011/0062312 | A1 | 3/2011 | Hosking et al. |
| 2012/0132242 | A1 | 5/2012 | Chu et al. |
| 2012/0192574 | A1 | 8/2012 | Ghoshal et al. |
| 2013/0003765 | A1 | 1/2013 | Connolly et al. |
| 2013/0027068 | A1 | 1/2013 | Li et al. |
| 2013/0133338 | A1 | 5/2013 | Ludwig |
| 2013/0133339 | A1 | 5/2013 | Kim |
| 2013/0139524 | A1 | 6/2013 | Kim |
| 2013/0284227 | A1 | 10/2013 | Scheben et al. |
| 2013/0285686 | A1 | 10/2013 | Malik et al. |
| 2014/0103947 | A1 | 4/2014 | Phan et al. |
| 2014/0240913 | A1 | 8/2014 | Vyshetsky |
| 2015/0372448 | A1 | 12/2015 | Connolly et al. |
| 2017/0023281 | A1 | 1/2017 | Fromm et al. |

FOREIGN PATENT DOCUMENTS

| | | |
|---|---|---|
| KR | 20000059576 | 8/2008 |
| KR | 20090024413 A | 3/2009 |
| KR | 20120121676 A | 11/2012 |
| KR | 20130061487 A | 6/2013 |
| WO | 0063968 A1 | 10/2000 |
| WO | 2015001523 A1 | 1/2015 |
| WO | 2017210108 A1 | 12/2017 |

OTHER PUBLICATIONS

International Search Report and Written Opinion dated Apr. 9, 2020, on application No. PCT/US2019/065764.
International Search Report and Written Opinion dated Jun. 17, 2021, on application No. PCT/US2021/119359.
International Search Report and Written Opinion dated Jun. 17, 2021, on application No. PCT/US2020/064377.
Extended European Search Report for Application No. 19895124.6, dated Dec. 8, 2022, 11 pages.
Extended European Search Report for European Application No. 19896653.3, dated Jul. 26, 2022, 8 Pages.
International Search Report and Written Opinion for International Application No. PCT/US2020/064362, dated Apr. 5, 2021, 6 Pages.

* cited by examiner

THERMAL CHAMBER FOR A THERMAL CONTROL COMPONENT

RELATED APPLICATIONS

This application is a continuation of U.S. patent application Ser. No. 16/218,038 filed on Dec. 12, 2018, the entire contents of all are hereby incorporated by reference herein.

TECHNICAL FIELD

The present disclosure generally relates to a thermal chamber, and more specifically, relates to a thermal chamber for a temperature control component.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
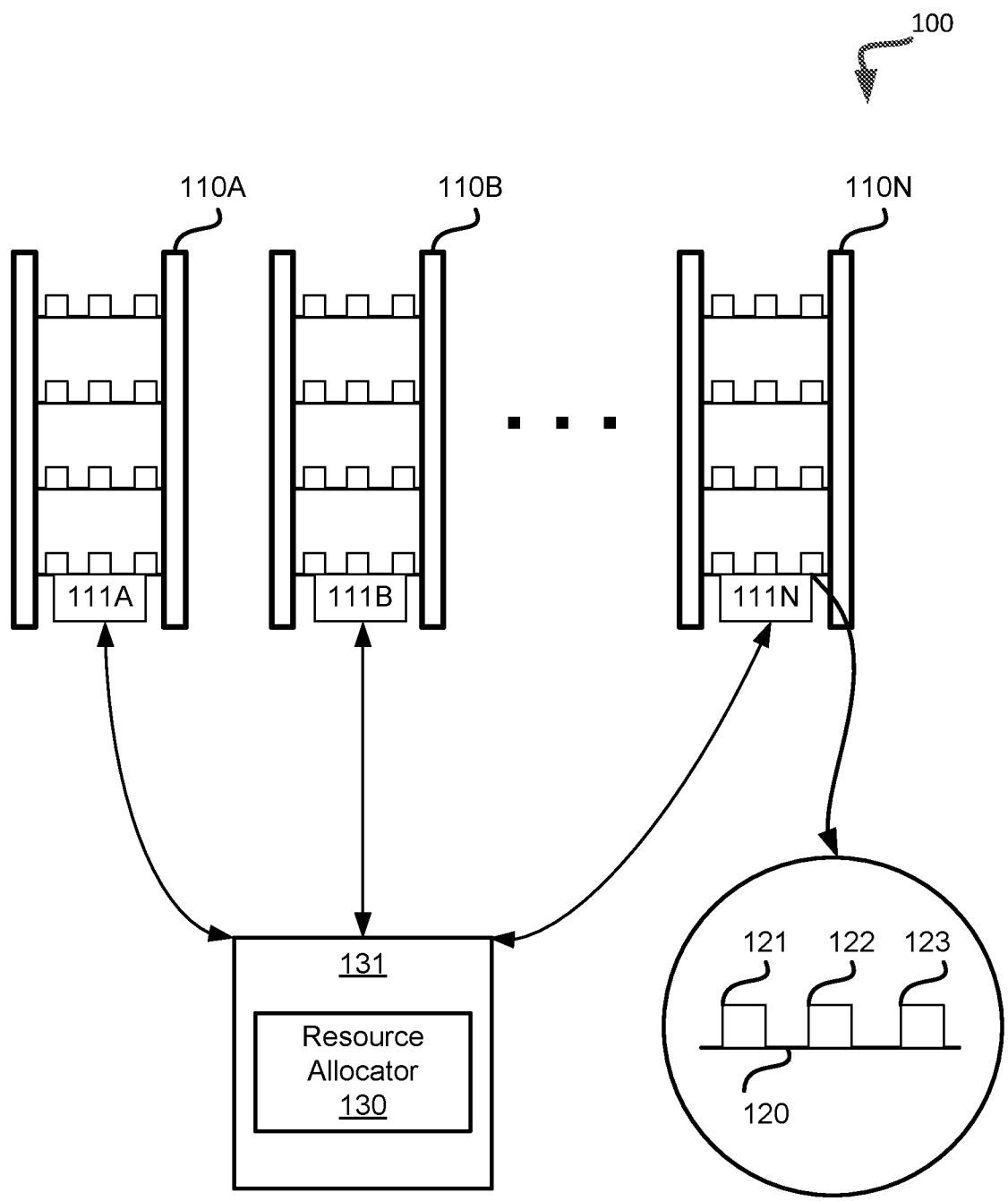
FIG. 1 illustrates an example environment to allocate test resources to perform a test of memory components, in accordance with some embodiments of the disclosure.

Aspects of the present disclosure are directed to a thermal chamber for a thermal transfer component. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be a hybrid memory/storage sub-system. In general, a host system can utilize a memory sub-system that includes one or more memory components. The host system can provide data to be stored at the memory sub-system and can request data to be retrieved from the memory sub-system.

Electrical devices, such as memory components that are used in a memory sub-system, can be tested before being utilized in a system. In a conventional test process, the electrical devices can be placed into a chamber (i.e., an oven) that tests the electrical devices under various temperature conditions. For example, a single chamber can be used to test multiple memory components at a single time at a particular temperature. Hot or cold gas can be pumped into the chamber to control the temperature of the chamber and the temperature of the electrical devices therein. The test process can instruct various operations to be performed at the electrical devices at the particular temperature. Such operations can include, but are not limited to, read operations, write operations, or erase operations. The performance and behavior of the electrical devices can be observed or measured while the test process is performed. For example, performance characteristics (e.g., read or write latencies) and reliability of data stored at the memory components can be measured and recorded during the test process. However, since the chamber can only apply a single temperature to the electrical devices at any particular time, the testing of the electrical devices at many different temperatures can require a large amount of time as the test process will need to be performed for each desired temperature. Additionally, the chamber can only perform a single test process at a time. As such, performing different tests on the electrical devices at different operating conditions (e.g., different temperatures) can utilize a large amount of time if many different conditions of the test process for the electrical devices are desired. Further, as the temperature in the chamber is cycled through different temperatures within the temperature testing range, condensate, such as water and ice, can form at the electrical devices and other associated electronics and cause damage, inaccurate test measurements, or catastrophic failures.

Aspects of the present disclosure address the above and other deficiencies by using a thermal chamber with multiple sides, such as a back side, front side, first end, second end, top side, and bottom side. The multiple sides are coupled to form a cavity. The top side includes one or more ports. Each of the ports exposes the cavity within the thermal chamber. Each of the ports is configured to receive a temperature control component that transfers thermal energy to and from an electrical device exposed via the cavity. Each of the temperature control components can concurrently apply a different (or same) temperature to the respective electrical devices via the cavity of the thermal chamber. The bottom side of the thermal chamber includes a bottom side open area that allows the temperature control component to contact the electrical device that is exposed via the bottom side open area.

In embodiments, the thermal chamber can have a gas port that allows a gas source to couple to the thermal chamber and provides gas to the cavity of the thermal chamber. The gas can have a dew point that is below the lowest testing temperature in the range of testing temperatures. In some embodiments, the gas source can create a positive pressure environment in the cavity of the thermal chamber such that the only gas entering or leaving the chamber is from the gas source. By providing gas with a low dew point and creating a positive pressure environment within the cavity of the thermal chamber, condensate is not allowed to form at the electrical devices under test or at the associated electrical components. It can be noted that in some embodiments, rather than change the temperature of the cavity via the injection of hot or cold gas, the temperature control component coupled to the thermal chamber changes the temperature at the electrical device and the gas provided to the thermal chamber maintains a low moisture environment without materially impacting the temperature in the cavity of the chamber.

Advantages of the present disclosure include, but are not limited to, providing a thermal chamber that allows electrical devices in a given chamber to be tested under different temperature conditions at a given instance. The thermal chamber disclosed herein can be configured to concurrently apply a wide range of thermal conditions to electrical devices under test and concurrently apply different thermal conditions to electrical devices coupled to the same circuit board. Additionally, aspects of the present disclosure provide a thermal chamber that prevents condensate from forming at the electrical devices under test throughout a wide range of testing temperatures. As such, many different tests of the electrical devices can be performed more quickly and the reliability of the electrical devices can also be increased as any potential defects or flaws can be identified and later addressed in the design or manufacturing of the electrical devices.

FIG. 1 illustrates an example environment to allocate test resources to perform a test of memory components, in accordance with some embodiments of the disclosure. A test platform 100 can include one or more racks 110A, 110B, and 110N. Each of the racks 110A, 110B, and 110N can include multiple test boards 120 where each test board 120 includes one or more test sockets (i.e., test resources). The test platform 100 can include any number of racks or test sockets. In some embodiments, a socket can refer to an electromechanical device that physically or electrically couples an electrical device, such as an active electrical device or passive electrical device, to a test board 120. A circuit board can be an example of a test board 120. In some embodiments, the electrical device can be a discrete component that is encased in a package (e.g., ceramic packaging material). The package material can have pins, solder bumps, or terminals external to the package that connect on-chip or on-die elements to off-chip or off-die elements (e.g., a power supply, other components at the circuit board, etc.). As shown, a test board 120 can include one or more test sockets. For example, a test board 120 can include a first test socket 121, a second test socket 122, and a third test socket 123. Although three test sockets are shown, a test board 120 can include any number of test sockets. In embodiments, each test socket can include an electrical device, such as a memory component, that has been embedded within the respective test socket. Additionally, each test socket can be fitted with a temperature control component that is used to apply a temperature condition to the embedded electrical device. For example, the temperature control component can be physical contact the package of a memory component to adjust the package temperature or on-die temperature to a desired temperature value in a temperature range. In some embodiments, the temperature range can be −40 degrees Celsius to 140 degrees Celsius.

In some embodiments, the temperature control component can be used to apply a temperature local to a respective electrical device that is different than a temperature that is applied by another temperature control component to another respective electrical device at the same or different test board 120. For example, a first temperature control component can apply a temperature of −20 degrees Celsius to a particular memory component, and another temperature control component located adjacent to the first temperature control component can apply a temperature of 100 degrees Celsius to another memory component that is located at the same test board 120.

In some embodiments, the temperature control component can be a dual thermoelectric component (TEC) (also referred to as "thermoelectric cooler" herein) (e.g., two TEC devices) that utilize a Peltier effect to apply a heating or cooling effect at a surface of the dual TEC device that is coupled to the embedded memory component. For example, a bottom part of the temperature control component can contact the package of the electrical device to transfer thermal energy to and from the electrical device. In some embodiments, the thermoelectric component can be a Peltier device. In some embodiments, the thermoelectric component can include an array of alternating n-type and p-type semiconductors disposed between two plates, such as two ceramic plates. A voltage applied to the thermoelectric component causes one plate to cool while another plate heats. In the same or alternative embodiments, the temperature control component can be placed on top of the memory component in the respective test socket.

As shown, each test rack 110A, 110B, and 110N can include multiple test boards 120. Each of the test boards 120 of a particular test rack can be coupled with a local test component. For example, each test rack 110A, 110B, and 110N can respectively include a local test component 111A, 111B, and 111N. Each of the local test components 111A, 111B, and 111N can receive instructions to perform a test or a portion of a test that is to be performed at the test sockets of the respective test rack. For example, a resource allocator component 130 can receive (e.g., from a user) conditions of the test that is to be performed and the resource allocator component 130 can determine particular test sockets across the different test boards 120 at one or more of the test racks 110A, 110B, and 110N that can be used by the test. In some embodiments, the resource allocator component 130 can be provided by a server 131. In some embodiments, the server 131 is a computing device or system that is coupled with the local test components 111A, 111B, and 111N over a network.

The temperate control component of each test socket 121, 122, and 123 of each test board 120 can be used to apply a different temperature condition to the respective embedded memory component. Furthermore, each test socket 121, 122, and 123 can be used to perform different operations at the embedded memory component.

The resource allocator component 130 can receive a test input from a user. The test input can specify conditions of the test that is to be performed with one or more memory components. For example, the test can specify particular temperature conditions that are to be applied to memory components and a sequence of operations that are to be performed at memory components under particular temperature conditions. The resource allocator 130 can retrieve a data structure that identifies available test sockets across the test platform 100 as well as characteristics of the available test sockets. Subsequently, the resource allocator component 130 can assign test sockets at the test platform 100 that include embedded memory components that match or satisfy the conditions of the test. The resource allocator component 130 can then transmit instructions to local test components of test racks that include test sockets that are to be used in the test.

In some embodiments, one or more of the test boards 120 of test platform 100 can be used with one or more thermal chambers (also referred to as a "micro-thermal chamber" or "enclosure" herein). For example, a test board 120 can include multiple test sockets 121, 122, and 123. A thermal chamber can be fitted above the multiple test sockets 121, 122, and 123. In another example, a different thermal chamber can be fitted above each of the multiple test sockets 121, 122, and 123. The thermal chamber can include one or more ports. The one or more ports can expose a cavity (also referred to as a "chamber" herein) within the thermal chamber. The electrical devices coupled to the test sockets of test board 120 are accessible from the one or more ports. In some embodiments, the one or more ports are configured to receive a temperature control component. In some embodiments, the bottom part of the temperature control component extends within the cavity of the thermal chamber and contacts a respective electrical device. The top part of the temperature control component, such a heat sink, can extend above the thermal chamber. In some embodiments, the temperature control component can be coupled to the thermal chamber. In some embodiments, the thermal chamber can be used to hold the temperature control component in-place. In some embodiments, the thermal chamber can align the temperature control component with the respective test socket and respective electrical device so that the bottom part of the temperature control component can make physical contact the respective electrical device. In embodiments where the thermal chamber includes multiple ports that hold multiple temperature control components, the thermal chamber can used to help apply the temperature control component with similar or equal or consistent pressure to each of the respective electrical devices. The multiple temperature control components can concurrently apply different temperatures to the respective electrical device within the thermal chamber. A thermal chamber is further described below at least with respect to FIG. 3 and FIG. 4A-4B.

Figure 2A:
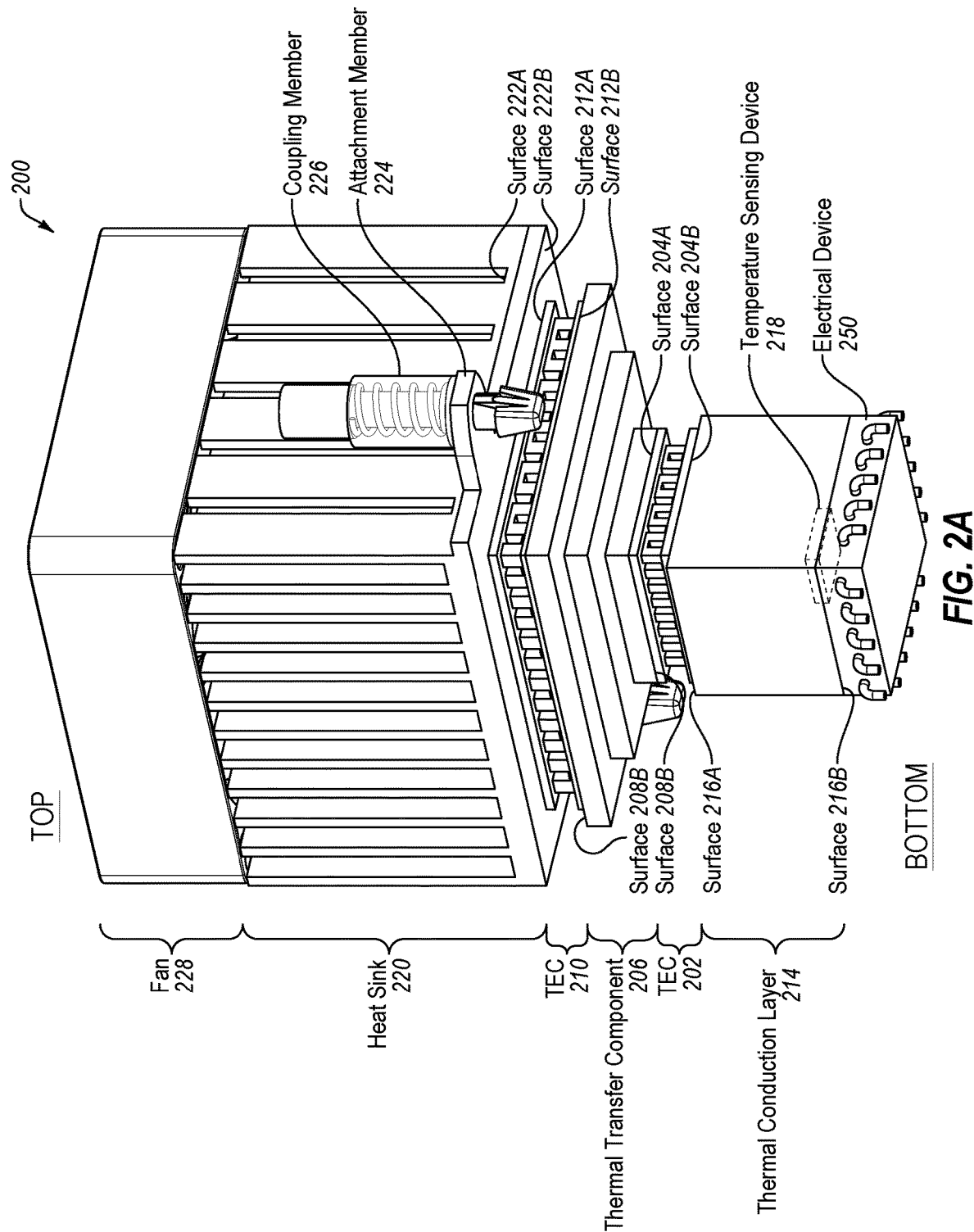
FIGS. 2A-2B illustrate a temperature control component, in accordance with some embodiments of the disclosure.
Figure 2B:
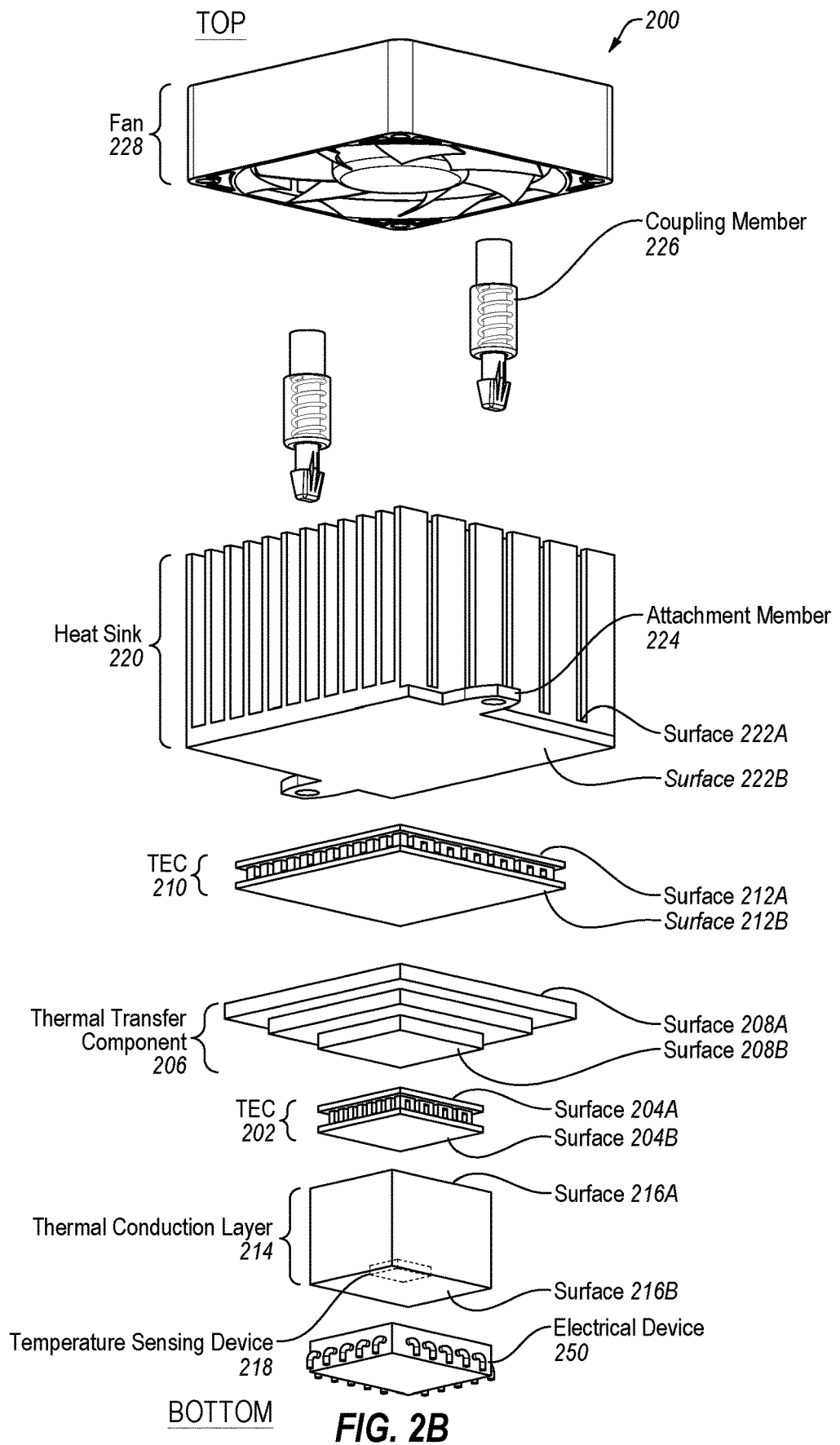

FIGS. 2A-2B illustrate a temperature control component, in accordance with some embodiments of the disclosure. FIG. 2A illustrates temperature control component in a collapsed view, in accordance with some embodiments of the disclosure. FIG. 2B illustrates temperature control component in an expanded view, in accordance with some embodiments of the disclosure. Temperature control component 200 is illustrated with a number of elements for purposes of illustration, rather than limitation. In other embodiments, temperature control component 200 can include the same, different, fewer, or additional elements. Temperature control component 200 is illustrated with relative positional relationships, top and bottom, for purposes of illustration rather than limitation. It can be noted that assigning other positional relationships to temperature control component 200 and the elements of the temperature control component 200 is within the scope of the disclosure.

A thermoelectric component (TEC) (also referred to as a "thermoelectric cooler") can transduce electrical energy into thermal energy, and vice versa. A TEC can include two surfaces. When a voltage potential is applied to the TEC one surface heats while the other opposing surface concurrently cools. However, in some instances applying a single TEC to an electrical device does not transfer enough thermal energy to meet the temperature testing range (e.g., −40 degrees Celsius to 130 degrees Celsius) for some electrical devices.

A TEC can generate more thermal energy at one surface than the TEC dissipates at an opposing surface. For example, for every 1 degree Celsius change at a first surface of a TEC, the opposing surface of the TEC generates approximately 3 degrees Celsius. Since the TEC generates a disproportionate amount of heat for each degree of cooling, removing the excess heat from one surface while cooling an electrical device with an opposing surface can be challenging. The challenges are particularly acute when testing electrical devices at extremely low temperatures, as the amount of heat generated is a multiple of the heat removed. Using a single TEC is often not sufficient in transferring enough thermal energy to meet the temperature testing ranges for electrical devices.

To address the removal of excess heat, two TEC with varying sizes can be stacked directly upon one another. For example, a larger TEC can be stacked directly above a smaller TEC. As the bottom surface of the smaller TEC cools an object, the top surface of the smaller TEC produces heat. The bottom surface of the larger TEC contacts the top surface of the smaller TEC and removes the heat generated by the top surface of the smaller TEC by cooling the bottom surface of the larger TEC. As the bottom surface of the larger TEC is cooled, the top surface of the larger TEC produces even more heat. The larger TEC can theoretically dissipate more thermal energy and help to dissipate the excess heat from the smaller TEC. However, stacking two TECs on top of one another can be highly inefficient and is often not sufficient in transferring enough thermal energy to meet the temperature testing ranges for electrical devices. When two TECs are stacked on one another, the heat generated by the smaller TEC is localized at the footprint of the smaller TEC and not evenly distributed over the entire bottom surface of the larger TEC. As such, the larger TEC does not efficiently remove heat from the top surface of the smaller TEC, which restricts the lower temperatures that can be applied to the electrical device.

In embodiments, a temperature control component 200 as described herein can address the above and additional challenges. In embodiments, the temperature control component 200 can include a thermal transfer component 206 that is tapered such that a bottom surface 208B that is coupled to a smaller TEC 202 has a smaller surface area than a top surface 208A that is coupled to larger TEC 210.

In embodiments, temperature control component 200 includes thermoelectric component (TEC) 202. In embodiments, the TEC, such as TEC 202, can serve as a heat pump to deliver heat to or remove heat from a surface. TEC 202 includes two surfaces 204, top surface 204A and bottom surface 204B. A TEC, such as TEC 202, is configured to concurrently increase the temperature of the top surface (e.g., top surface 204A) and decrease temperature of the bottom surface (e.g., bottom surface 204B), or concurrently decrease the temperature of the top surface (e.g., top surface 204A) and increase the temperature of the bottom surface (e.g., bottom surface 204B) based on a voltage potential applied to the TEC. In embodiments, the TEC, such as TEC 202 and TEC 210, includes a set of electrical wires to couple a voltage potential to the TEC and deliver the requisite current to the TEC.

In embodiments, temperature control component 200 includes TEC 210. TEC 210 can include two surfaces 212, such as top surface 212A and bottom surface 212B. In embodiments, the bottom surface 212B is coupled to the top surface 208A of thermal transfer component 206. In embodiments, TEC 210 is larger than TEC 202. In some embodiments, the bottom surface 212B of TEC 210 has a surface area approximately two times larger than the surface area of the top surface 204A of TEC 202. In some embodiments, TEC 210 is sized to efficiently transfer heat away from TEC 202. In some embodiments, TEC 210 has a minimum of two times the heat transfer capability of the TEC 202. As noted herein, the TEC 210 can have a surface area that is two times the surface area of TEC 202 so that the heat transfer capability of TEC 210 is at least two times that of TEC 202. It can be noted that in some embodiments, that TEC 210 can have a surface area that is similar to TEC 202 (or at least less than twice the surface area of TEC 202) but have twice the power and heat transfer capability.

For purposes of illustration rather than limitation, square TECs are illustrated. In other embodiments, TECs of different shapes can be implemented, such a rectangular TECs or round TECs. In some embodiments, the two TECs can be different shapes. The selected TECs can be based on the surface shape of the electrical device 250. For example, if the package of electrical device 250 is square using a square TEC (at least for TEC 202) can help to optimally transfer thermal energy to and from electrical device 250. It can be noted that using TECs with different shapes is within the scope of the disclosure.

In embodiments, temperature control component 200 includes thermal transfer component 206. In embodiments, the thermal transfer component 206 efficiently conducts thermal energy from a surface of one TEC to an opposing surface of another TEC. For example, to cool electrical device 250 under test, bottom surface 204B of TEC 202 removes thermal energy (e.g., heat) from the top surface of electrical device 250. The top surface 204A of TEC 202 concurrently generates thermal energy, which is transferred via thermal transfer component 206 to the bottom surface 212B of TEC 210.

In embodiments, the thermal transfer component 206 is composed or made of a thermally conductive material. Thermally conductive materials include, but is not limited to, copper, aluminum, copper brass, or alloys of the aforementioned materials. It can be noted that other thermally conductive materials can be used. It can also be noted that materials having a higher thermal conductivity (k) can more efficiently transfer thermal energy between TEC 202 and TEC 210.

In embodiments, thermal transfer component 206 includes at least two surfaces 208, including a top surface 208A and a bottom surface 208B. The bottom surface 208B of thermal transfer component 206 is coupled to the top surface 204A of TEC 202. The top surface 208A of thermal transfer component 206 is coupled to the bottom surface 212B of TEC 210.

In some embodiments, the thermal transfer component 206 can be coupled to a surface of an adjacent element using a thermal interface material, such as thermally conductive adhesives, thermal greases, phase change materials, thermal tapes, gap filling thermal pads, thermal epoxies, and so forth. For example, a thermal interface material can be disposed between the top surface 204A of TEC 202 and the bottom surface 208B of thermal transfer component 206, and between the top surface 208A of thermal transfer component 206 and the bottom surface 212B of TEC 210. In some embodiments, the thermal interface material can have at least a minimum conductivity of 150 Watts per meter-Kelvin (W/mk) or greater.

In embodiments, the thermal transfer component 206 is tapered such the bottom surface 208B is smaller than the top surface 208A. In some embodiments, the top surface 208A of the thermal transfer component 206 has a surface area that is approximately two times larger than a surface area of the bottom surface 208B of the thermal transfer component 206. In some embodiments, top surface 208A and bottom surface 208B of thermal transfer component 206 are sized to match or be close in size to the surface of the respective TEC. In some embodiments, one or more of top surface 208A and bottom surface 208B of thermal transfer component 206 can have a surface area that is 95% to 120% the surface area of the respective surface of the respective TEC.

As noted above, in embodiments, a surface of a TEC generates more thermal energy than an opposing surface of the TEC dissipates. To maximize the potential energy transfer capabilities of the larger TEC, the thermal energy can be spread across the entire surface of the larger TEC. A tapered thermal transfer component 206 allows for the efficient transfer of thermal energy between a smaller TEC 202 and a larger TEC 210. For example, heat from top surface 204A of TEC 202 is conducted through thermal transfer component 206 and spread across the bottom surface 212B of TEC 210 using a tapered thermal transfer component 206. The larger TEC 210 can move the thermal energy from the bottom surface 212B to the opposing surface (e.g., top surface 212A).

In embodiments, the thermal transfer component 206 can be step pyramid shaped as illustrated. In other embodiments, thermal transfer component 206 can have different shapes, such as a flat-sided pyramid that is tapered from a top surface to a bottom surface. In some embodiments, the shape of the thermal transfer component 206 can be based in part on the shape of the TEC that contacts a surface of the thermal transfer component 206. For example, in implementations that use round TECs the shape of the thermal transfer component 206 can be conical where the bottom surface and the top surface of the thermal transfer component 206 are round. In some embodiments, the thickness of the thermal transfer component 206 (between surface 208A and surface 208B) is greater than or equal to the thickness of one of TEC 202 or TEC 210. In some embodiments, the thermal transfer component 206 can include a thermal conduction layer 214. The thermal conduction layer 214 layer can include a top surface 216A and a bottom surface 216B. In embodiments, the top surface 216A of the thermal conduction layer 214 is coupled to the bottom surface 204B of TEC 202. In some embodiments, the thermal conduction layer 214 can transfer thermal energy from the bottom surface 204B of TEC 202 to the bottom surface 216B of thermal conduction layer 214.

In some embodiments, the bottom surface 216B of thermal conduction layer 214 can be positioned to contact the top surface of electrical device 250. For example, the bottom surface 216B of thermal conduction layer 214 can be positioned to contact the top surface of the package of the electrical device 250 so that the package temperature of the electrical device 250 or the on-chip temperature of the electrical device 250 can be controlled to a desired temperature. In some embodiments, the thermal conduction layer 214 can be configured to fit within the socket that couples the electrical device 250 to a circuit board so that the bottom surface 216B of the thermal conduction layer 214 can physically contact the package of the electrical device 250 and transfer thermal energy.

In embodiments, the thermal conduction layer 214 can be coupled to TEC 202 using a thermal interface material, as described above. In embodiments, the thermal conduction layer 214 is composed of or made from a thermally conductive material, as described above.

In embodiments, the top surface 216A of thermal conduction layer 214 can be approximately that same size and the same shape as the bottom surface 204B of TEC 202. In some embodiments, the size and shape of surfaces 216 of thermal conduction layer 214 can be based on the size and shape of the top surface (e.g., contact surface) of the electrical device 250. For example, the thermal conduction layer 214 can be shaped so that the bottom surface 216B contacts most if not all (in some cases, more than) the top surface of electrical device 250. In some embodiments, the top surface 216A of the thermal conduction layer 214 is approximately the same size or larger than the bottom surface 204B of TEC 202. In some embodiments, the bottom surface 216B of the thermal conduction layer 214 can be the same size and shape as the top surface 216A of the thermal conduction layer 214. For example, the thermal conduction layer 214 can be a square cube or a rectangular cube. In some embodiments, the thermal conduction layer 214 can be tapered in one direction or another, e.g., from top surface 216A to bottom surface 216B or vice versa. It can be noted that that shape of thermal conduction layer 214 can be based at least in part on the shape of TEC 202 or the electrical device 250.

In some embodiments, thermal conduction layer 214 can be an optional element and TEC 202 can make direct physical contact with electrical device 250 to transfer thermal energy to and from electrical device 250.

In some embodiments, the temperature control component 200 can include a thermal sensing device 218. In some embodiments, the thermal sensing device 218 can be disposed or embedded within the thermal conduction layer 214. The thermal sensing device 218 can be located within thermal conduction layer 214 so that the temperature sensing surface of the thermal sensing device 218 is in close proximity to the bottom surface 216B of thermal conduction layer 214. Thermal sensing device 218 can be used to measure the temperature applied to the package of electrical device 250, which can effectively represent the temperature at the package of the electrical device 250 due to the low thermal resistance (k) of thermal conduction layer 214. In embodiments, the thermal sensing device 218 can be any temperature sensing device such as a thermocouple, capacitive temperature sensing device, resistive temperature sensing device, and so forth. In embodiments, the thermal sensing device 218 can include a set of electrical wires to couple the thermal sensing device 218 to a measurement unit to measure the output of the thermal sensing device 218.

In some embodiments, the electrical device 250 can include one or more temperature sensing devices, such as an on-chip temperature sensing device. The on-chip temperature can be different than the package temperature of the electrical device 250 due to thermal resistance of the package. Temperature measurements from the on-chip temperature sensing device, the thermal sensing device 218 of the thermal conduction layer 214, or both can be used to perform thermal testing on the electrical device 250.

In some embodiments, temperature control component 200 can include a heat sink 220. The heat sink 220 can include a top surface 222A and a bottom surface 222B. In embodiments, the top surface 222A can include a greater surface area than the bottom surface 222B to help facilitate thermal energy transfer from the heat sink 220 to an adjacent medium. In embodiments, the bottom surface 222B of heat sink 220 is coupled to the top surface 212A of TEC 210 to transfer thermal energy from TEC 210 to the heat sink 220. In embodiments, the heat sink 220 and TEC 210 are coupled using a thermal interface material, as described above. In embodiments, the heat sink 220 is composed of thermally conductive material, as described above.

In some embodiments, the heat sink 220 is a passive mechanical device. In embodiments, the top surface 222A of the heat sink 220 includes multiple channels and multiple fins disposed between the channels. In other embodiments, the heat sink 220 can be another type of heat sink, such a liquid cooled heat sink and so forth.

In some embodiments, heat sink 220 includes one or more attachment members 224. In embodiments, the attachment members can be used to secure the temperature control component 200 to a thermal chamber. In some embodiments, the attachment members 224 are configured to receive adjustable coupling members 226 that can adjustably couple the temperature control component 200 to a thermal chamber. In some embodiments, the adjustable coupling member can include a spring element that allows a vertical position of the temperature control component 200 that is mounted to the thermal chamber to be adjusted.

In some embodiments, temperature control component 200 can include a fan, such as electric fan 228. In embodiments, the electric fan 228 is disposed above the top surface 222A of heat sink 220 and used to transfer thermal energy from the heat sink 220 to an adjacent medium, such as the gas medium local the temperature control component 200. The electrical fan 228 can include a set of electric wires that coupled to a voltage potential.

A single thermal transfer component 206 is shown for purposes of illustration, rather than limitation. In other embodiments, multiple thermal transfer components 206 can be used. For example, an additional thermal transfer component can be stacked on the top surface 212A of TEC 210. The additional thermal transfer component can be larger than thermal transfer component 206. For example, the bottom surface of the additional thermal transfer component can be approximately the same size as the top surface 212A of TEC 210. The additional thermal transfer component can be tapered such that the top surface of the additional thermal transfer component is larger than the bottom surface. In embodiments, the top surface of the additional thermal transfer component can be coupled to a TEC that is larger than (e.g., greater surface area) TEC 210. Any number of additional thermal transfer components or TECs can be implemented in other embodiments.

Figure 3:
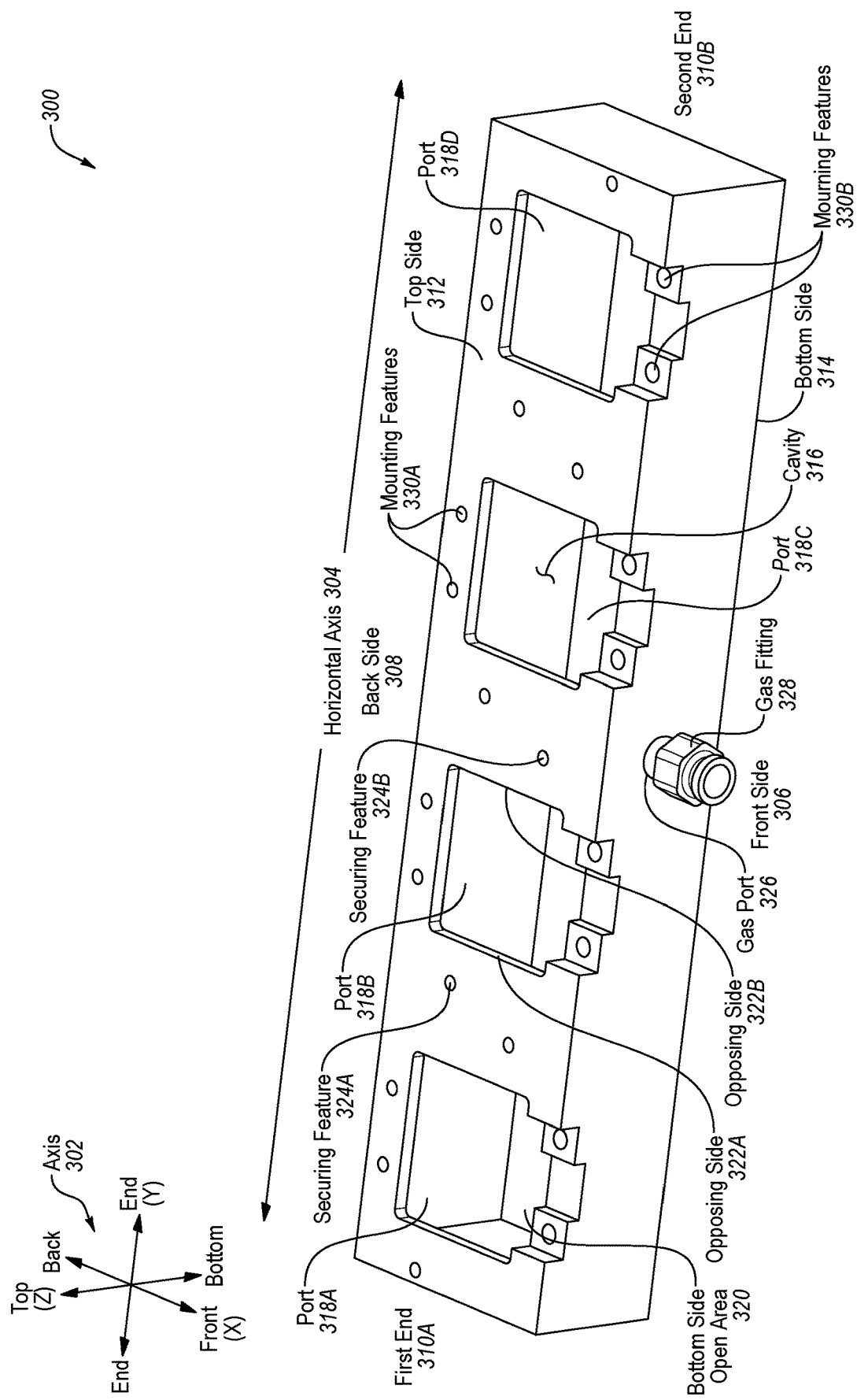
FIG. 3 illustrates a thermal chamber, in accordance with embodiments of the disclosure.

FIG. 3 illustrates a thermal chamber, in accordance with embodiments of the disclosure. Thermal chamber 300 is described with relative positional relationships, as shown by three-dimensional (3D) axis 302, for purposes of illustration rather than limitation. It can be noted that assigning other relative positional relationships to thermal chamber 300 is within the scope of the disclosure.

3D axis 302 includes the X-axis, the Y-axis, and the Z-axis. As illustrated, the X-axis points in the direction of the front and the back with respect to thermal chamber 300. The Y-axis points in the direction of the two ends with respect to thermal chamber 300. The Y-axis of 3D axis 302 corresponds to horizontal axis 304. The Z-axis points in the direction of the top and the bottom with respect to thermal chamber 300.

In embodiments, thermal chamber 300 includes multiple sides, such a multiple rigid sides. The multiple rigid sides include a back side 308 that is orientated parallel to horizontal axis 304, a front side 306 that is orientated parallel to the horizontal axis 304, end 310A that is orientated perpendicular to the horizontal axis 304 (e.g., along the X-axis), and end 310B that is orientated perpendicular to horizontal axis 304 and located opposite the end 310A.

The multiple rigid sides of the thermal chamber 300 also include a top side 312 that is orientated perpendicular to and coupled to back side 308, front side 306, end 310A, and end 310B. The multiple rigid sides of the thermal chamber 300 also include a bottom side 314 that is orientated parallel to and located opposite the top side 312. In embodiments, the multiple rigid sides form a cavity (also referred to as a "chamber" herein) 316 that is enclosed by the multiple rigid sides.

In embodiments, the top side 312 includes one or more ports 318 orientated along a first direction of the horizontal axis 304. It can be noted that port 318A, 318B, 318C, and 318D are generally referred to as ports 318. It can be further noted that thermal chamber 300 illustrates multiple ports 318 aligned along the horizontal axis 304, for purposes of illustration rather than limitation. In other embodiments, thermal chamber 300 can include any number of ports 318 located anywhere with respect to thermal chamber 300. In embodiments, each of the ports include an open area (also referred to as "top side open area" herein) that exposes the cavity 316 within the thermal chamber 300. In embodiments, each of the ports 318 is configured to receive a temperature control component, such as temperature control component 200 as described with respect to FIG. 2A-2B. The temperature control component 200 can be at a position of the thermal chamber 300 so that the temperature control component 200 transfers thermal energy to and from the electrical device that is exposed the via the cavity 316.

In embodiments, each top side open area that corresponds with a respective one of the ports 318 has a corresponding open area (also referred to as "bottom side open area 320" herein) at the bottom side 314. The bottom side open area 320 is located below (e.g., directly below) the corresponding top side open areas. As illustrated, the bottom side open area 320 is a single large open area. It can be noted that in other embodiments, multiple bottom side open areas can be used where each of the bottom side open areas correspond to a particular one of the ports 318 at the top side 312. In embodiments, the bottom side open area 320 is an area of the bottom side 314 that is configured to receive one or more electrical devices from the direction of the bottom side 314 and allow a temperature control component 200 (positioned at a respective one of the ports 318) to contact a respective electrical device that is exposed via the bottom side open area 320. In some embodiments, the one or more electrical devices are located below the bottom surface of the bottom side 314.

In some embodiments, one or more of the multiple rigid sides are composed of a material that is one or more of a thermal insulator, non-conductive, or antistatic material. In some embodiments, that multiple rigid sides can be composed of a phenolic material. In some embodiments, the multiple rigid sides are composed of a conductive material. The thermal chamber 300 composed of a conductive material can be grounded to a ground potential to help avoid electrostatic discharge damage at the electrical devices under test.

In some embodiments, each of the one or more ports 318 includes at least a pair of opposing sides, such as opposing side 322A and opposing side 322B (generally referred to as "opposing sides 322" herein) of port 318B. In embodiments, each of the one or more ports 318 can be associated with one or more securing features. Securing features allow the temperature control component 200 to be secured at the top side 312 of thermal chamber 300 and aligns the temperature control component 200 to contact the electrical device that is exposed via the bottom side open area 320 of thermal chamber 300. For example, securing feature 324A is located adjacent to opposing side 322A of port 318B. Securing feature 324B is located adjacent to opposing side 322B of port 318B. Securing feature 324A and 324B (generally referred to as "securing features 324" herein) are associated with port 318B and allow for a respective temperature control component 200 to be secured at port 318B. As illustrated, the other ports 318A, 318C, and 318D have similar securing features located in similar positions relative to the respective ports 318. In some embodiments, securing features 324 include holes through the top side 312 of the thermal chamber 300. In embodiments, securing features 324 are each configured to receive an adjustable coupling member to adjustably couple the temperature control component 200 to the thermal chamber 300 at the respective port 318. The number, shape, and locations of the securing features are provided for purposes of illustration, rather than limitation. In other embodiments, the number, shape, or location of the securing features can be different.

In embodiments, the thermal chamber 300 includes a gas port 326. The gas port 326 can be configured to allow gas into the cavity 316 of the thermal chamber 300 from an external gas source. The gas port 326 connects the outer surface of the thermal chamber 300 to the cavity of the thermal chamber 300. In some embodiments, the gas port 326 includes a hole, such as a circular hole, that is located at one of the multiple rigid sides. For example, the gas port 326 can be located at the front side 306, back side 308, end 310A, end 310B, top side 312, or bottom side 314 of the thermal chamber 300. In one embodiment, the gas port 326 is fitted with a gas fitting 328 that is coupled to the gas port 326. In embodiments, a part of the gas fitting 328 can be fitted within the gas port 326 and another part of the gas fitting 328 can extend outside the thermal chamber 300. In embodiments, the part of the gas fitting 328 that extends outside the thermal chamber 300 can be coupled to a gas hose that moves gas from a gas source into the cavity of the thermal chamber 300.

In some embodiments, the thermal chamber 300 includes multiple mounting features that allow the thermal chamber 300 to be mounted or secured to a circuit board located under the thermal chamber 300. In some embodiments, the mounting features are located on at least one of the back side 308, front side 306, end 310A, end 310B, bottom side 314, or top side 312 of the thermal chamber 300. For example, thermal chamber 300 illustrates mounting features 330A at the back side 308 of the thermal chamber 300 and mounting features 330B at the front side 306 of thermal chamber 300. Other mounting features are located at the back side 308 and front side 306 of the thermal chamber 300, but are not labeled. In some embodiments, the multiple mounting features include holes through at least one of the back side 308, front side 306, end 310A, end 310B, or top side 312 in the direction from the top side 312 to the bottom side 314. The holes are configured to receive a mounting mechanism to mount the thermal chamber 300 to the circuit board located under the thermal chamber 300. For example, the mounting mechanism can be a screw and nut set.

In some embodiments, the thermal chamber 300 can include a hinge (not shown). The hinge can allow the thermal chamber 300 to rise from (e.g., open) the circuit board about an axis of rotation to expose the electrical device(s) under test under the thermal chamber 300. In some embodiments, the hinge can allow the thermal chamber 300 to descend (e.g., close) to the circuit board to cover the underlying electrical device(s) and align the temperature control component 200 with a respective electrical device. In some embodiments, the hinge includes a first leaf, a second leaf and a pin. The pin defines an axis of rotation between the first leaf and the second lead. The first leaf is coupled to the thermal chamber 300 and the second leaf is coupled to the circuit board.

Figure 4A:
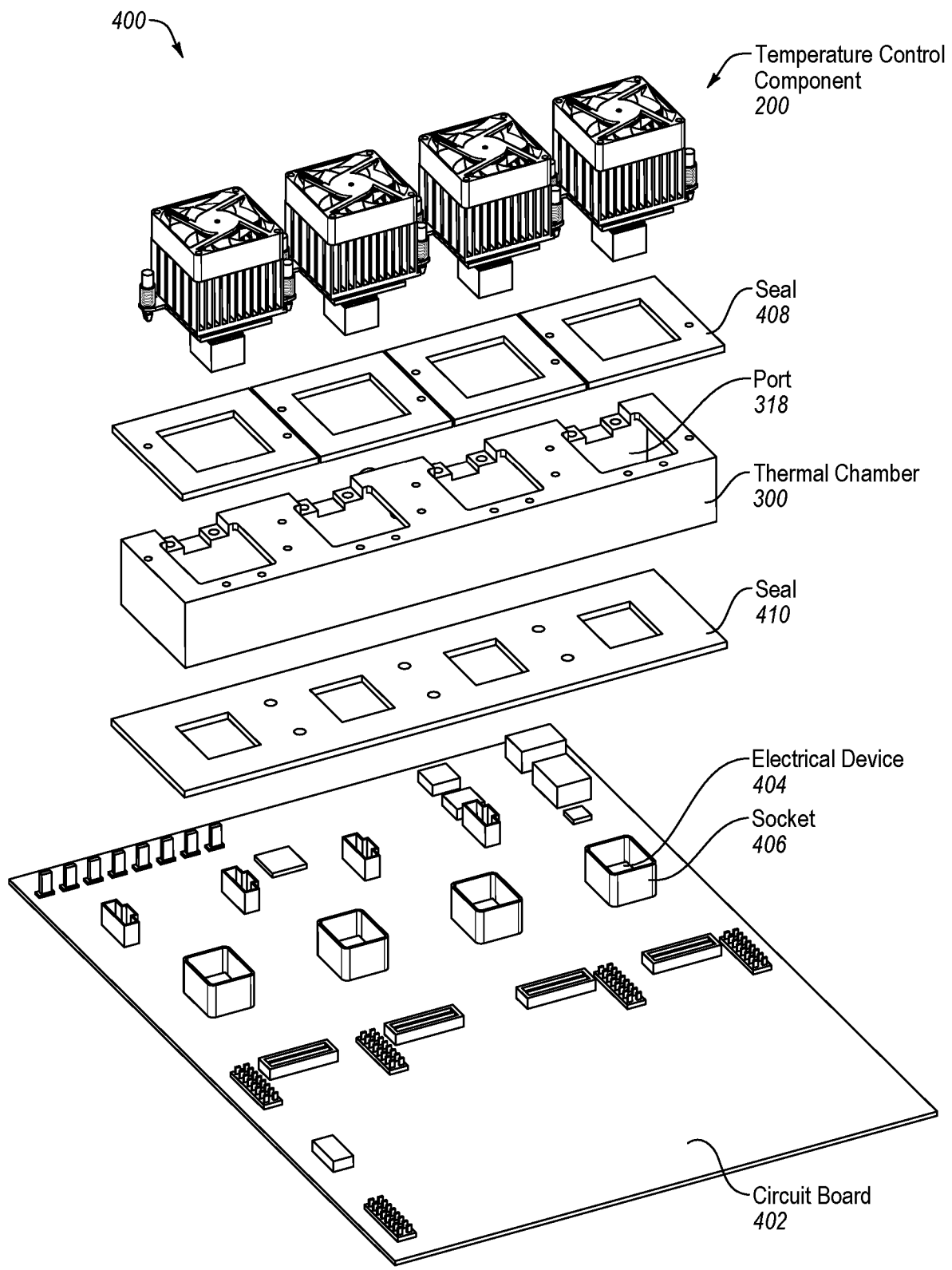
FIGS. 4A-4B illustrate a system to test an electrical device under a variety of thermal conditions, in accordance with embodiments of the disclosure.
Figure 4B:
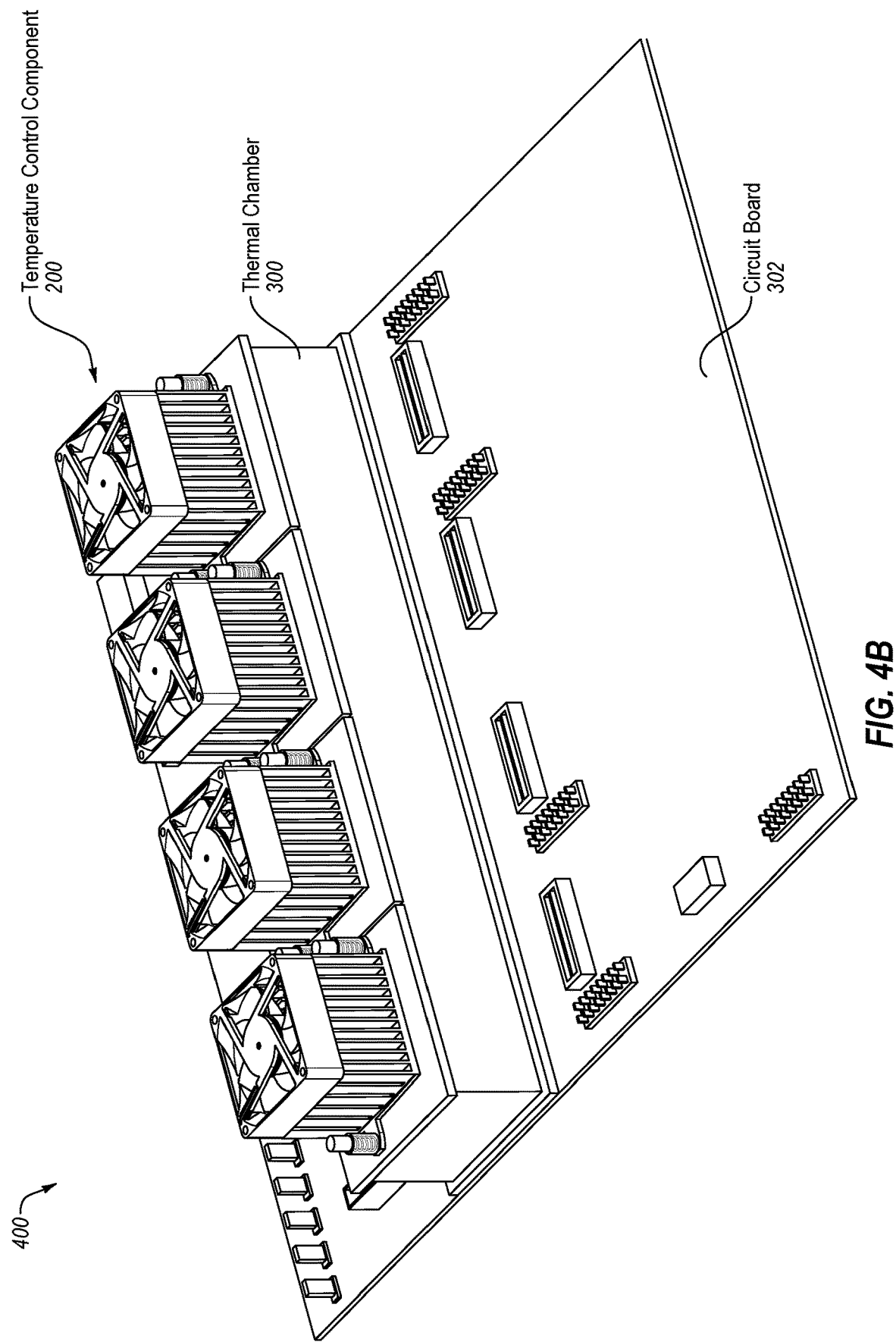

FIGS. 4A-4B illustrate a system to test an electrical device under a variety of thermal conditions, in accordance with embodiments of the disclosure. FIG. 4A illustrates system 400 in an expanded view, in accordance with embodiments of the disclosure. FIG. 4B illustrates system 400 in a collapsed view, in accordance with embodiments of the disclosure. It can be noted that a temperature control component, such as temperature control component 200 of FIGS. 2A-2B, can be used with or be part of system 400. It can also be noted that a thermal chamber, such as thermal chamber 300 of FIG. 3, can be used with or be part of system 400. Elements of temperature control component 200 of FIGS. 2A-2B and thermal chamber 300 of FIG. 3 are used to help illustrate aspects of FIGS. 4A-4B. System 400 can be used to test one or more electrical devices, such as electrical device 404, under a variety of thermal conditions as described herein. It can be noted that FIGS. 4A-4B illustrate four electrical devices. Multiple electrical devices are referred to as electrical devices 404. A single electrical device is referred to as electrical device 404. Reference to temperature control component(s) 200 and socket(s) 406 are made in a similar manner.

In embodiments, system 400 can include a circuit board 402. The circuit board 402 can be coupled to one or more electrical devices 404 under test. In embodiments, the circuit board 402 can facilitate electrical signal transfer to and from the one or more electrical devices 404 and to and from any additional elements coupled to the circuit board 402. In embodiments, the circuit board 402 can facilitate power transmission to and from the one or more electrical devices 404 and to and from any additional elements coupled to the circuit board 402. For example, temperature control component 200 can be coupled to the circuit board 402 and the circuit board 402 can supply power to the various elements of temperature control component 200. In some embodiments, the circuit board 402 can be used to transmit instructions to perform read operations, write operations, or erase operations at the electrical devices 404 during the performance of the thermal test. Furthermore, the circuit board 402 can be used to retrieve information or test data from the electrical devices 404 during the performance of the thermal test.

In some embodiments, the system 400 can include one or more sockets 406. A socket can be an electromechanical device that couples an electrical device to the circuit board 402. In embodiments, the sides of the socket 406 can extend vertically beyond the top surface of the electrical device 404. The bottom part of the temperature control component 200 (e.g., at least part of the thermal conduction layer 214) can be fitted within the socket 406.

In some embodiments, the thermal chamber 300 can include one or more ports 318. The one or more ports 318 can expose a cavity within the thermal chamber 300. The electrical devices 404 are coupled to the test sockets of circuit board and are accessible from the one or more ports 318.

In embodiments, thermal chamber 300 can be placed above the electrical devices 404 and above the circuit board 402. One or more temperature control components 200 are mounted at a top side of the thermal chamber 300. In some embodiments, each of the one or more ports 318 of the thermal chamber 300 is configured to receive a temperature control component 200. In some embodiments, the bottom part of the temperature control component 200 extends within the cavity of the thermal chamber 300 and contacts a respective electrical device to transfer thermal energy to and from the respective electrical device. The top part of the temperature control component 200 extends above the top side of the thermal chamber 300.

For example, the top part of the temperature control component 200, such as a heat sink, can extend above the thermal chamber 300. The bottom part of the temperature control component 200, such as the bottom surface 216B of the thermal conduction layer 214, physically contacts a top surface of the electrical device 404. The temperature control component 200 can transfer thermal energy to and from the electrical device 404. For example, temperature control component 200 can change the temperature of the electrical device 404 (e.g., package temperature or on-die temperature) in a temperature range from −40 degrees Celsius to 140 degrees Celsius.

In some embodiments, the temperature control component 200 can be coupled to the thermal chamber 300. In some embodiments, the thermal chamber 300 can be used to hold the temperature control component 200 in-place. In some embodiments, the thermal chamber 300 can align the temperature control component 200 with the respective test socket 406 and respective electrical device 404 so that the bottom part of the temperature control component 200 can make physical contact the respective electrical device 404. In embodiments where the thermal chamber 300 includes multiple ports that hold multiple temperature control components 200, the thermal chamber 300 using the adjustable coupling members can allow each of the temperature control components 200 to apply similar or equal or consistent pressure to each of the respective electrical devices 404. The multiple temperature control components 200 can concurrently apply different temperatures to the respective electrical devices 404 within the thermal chamber 300.

In some embodiments, seal 408 and seal 410 can be used with thermal chamber 300 to help seal thermal chamber 300 and create a positive pressure environment within the cavity of thermal chamber 300. In some embodiments, seal 408 and seal 410 do not hermetically seal the thermal chamber 300. Rather, seal 408 and seal 410 can decrease the amount of gas that escapes the thermal chamber 300 to help create a positive pressure environment. In embodiments, seal 408 and 410 can be composed of a non-conductive, insulating, or anti-static material, such as rubber or weather stripping. In embodiments, seal 410 is disposed between the circuit board 402 and the bottom side of the thermal chamber 300. In embodiments, seal 408 is disposed on the top side of the thermal chamber 300. In embodiments, seals with different configurations can be implemented. In some embodiments, seal 408 or 410 are not included in system 400.

In embodiments, the temperature control component 200 can include attachment members, such as attachment member 224 of FIGS. 2A-2B. In embodiments, the thermal chamber 300 can include securing features, such as securing features 324 of FIG. 3. In some embodiments, the adjustable coupling members can be coupled to the attachment members of the temperature control component 200 and the securing features 324 of the thermal chamber 300 to adjustably couple the temperature control component 200 to the thermal chamber 300. In some embodiments, the attachment members and the securing features are configured to receive adjustable coupling members that can adjustably couple the temperature control component 200 to the thermal chamber 300. In some embodiments, the adjustable coupling member can include a spring element that allows a vertical position of the temperature control component 200 that is mounted to the thermal chamber 300 to be adjusted.

In some embodiments the thermal chamber 300 can include a gas port to receive a gas, such as oil free air (OFA) or nitrogen gas or clean dry air or gas (CDA). In some embodiments, the gas can have a dew point lower than the expected cold temperatures range under test. In some embodiments, the gas can have less than 1 part-per-million (ppm) carbon dioxide and less than 0.003 ppm hydrocarbon vapor.

The thermal chamber 300 can be used to control the environment proximate to the electrical devices under test. In embodiments, the gas provided to the thermal chamber 300 has a dew point that is lower than the lowest temperature under which the electrical devices are to be tested. Such a gas is provided to the thermal chamber 300 so that condensate, such as moisture or ice, does not form at the electrical devices during test. For example, the package of the electrical device under test can be controlled within a temperature range from −25 degrees Celsius to 140 degrees Celsius. The dew point of the gas can be below −25 degrees Celsius (e.g., −90 degrees Celsius). When a temperature of −25C is applied to the electrical devices under test by the temperature control component 200, condensate does not form at the electrical devices based on the low dew point of the gas provided within the cavity of thermal chamber 300.

In some embodiments, rather than hermetically sealing the thermal chamber 300, the thermal chamber 300 (e.g., cavity within the thermal chamber 300) can be maintained as a positive pressure environment so that the only gas going into the thermal chamber 300 is from the gas port, and the only gas escaping the thermal chamber 300 is gas from the gas port.

In embodiments, rather than changing the temperature of the thermal chamber 300 using hot or cold gas, the temperature control component 200 can maintain the temperature environment local to each electrical device 404 under test. In embodiments where the thermal chamber 300 includes multiple temperature control components 200 coupled to multiple electrical devices 404, each of the temperature control components 200 can maintain a different (or same) temperature at the respective electrical devices 404 under test without using hot or cold gas. For example, a first electrical device under test can contact a first temperature control component. A second electrical device under test can contact a second control component. Both the first and the second temperature control component can be coupled to a single thermal chamber. The first temperature control component can maintain a temperature of the first electrical device at 100 degrees Celsius while the second temperature control component can maintain a temperature of the second electrical device at 0 degrees Celsius.

Figure 5A:
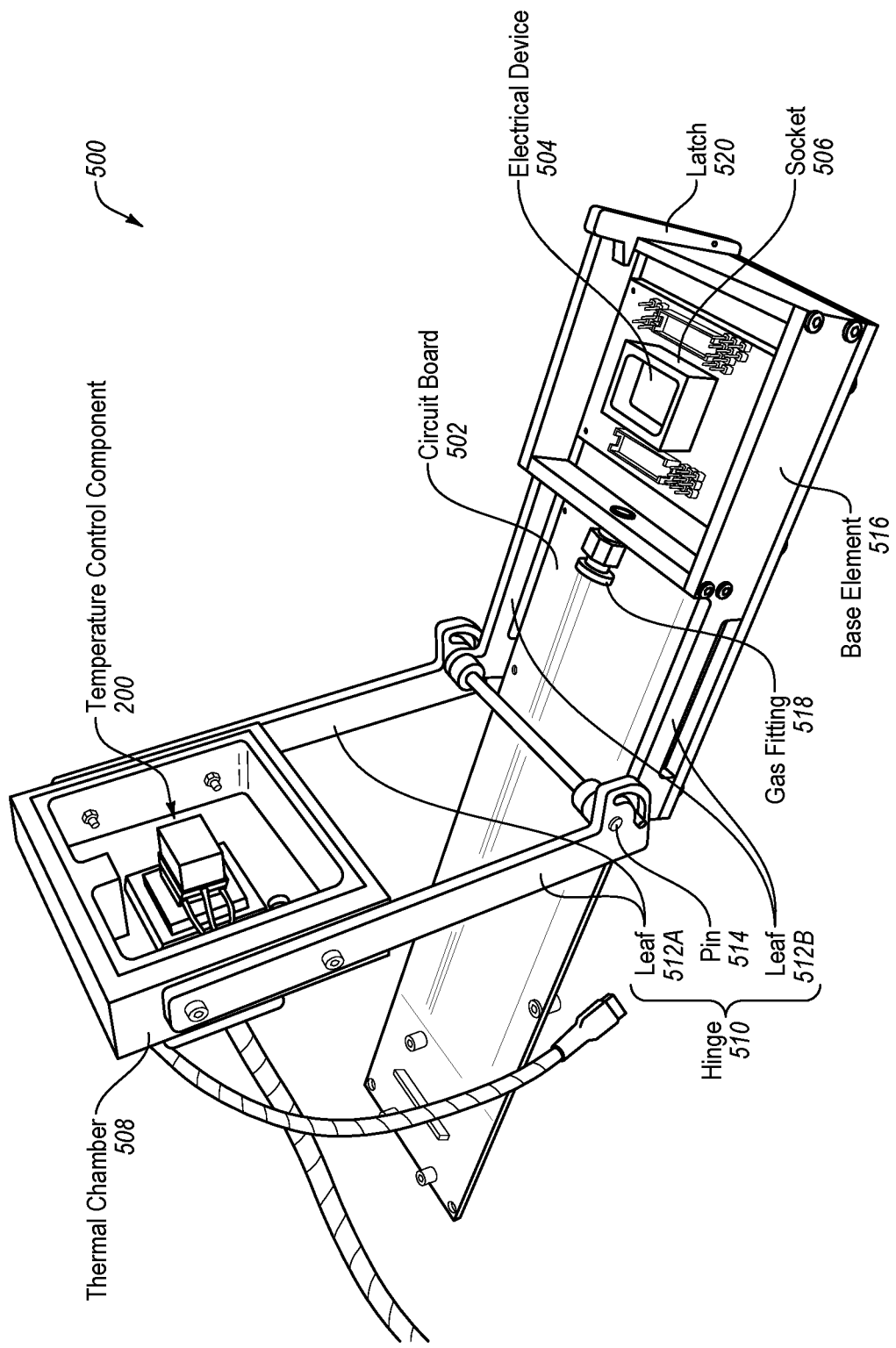
FIGS. 5A and 5B illustrate a system to test an electrical device under a variety of thermal conditions, in accordance with embodiments of the disclosure.
Figure 5B:
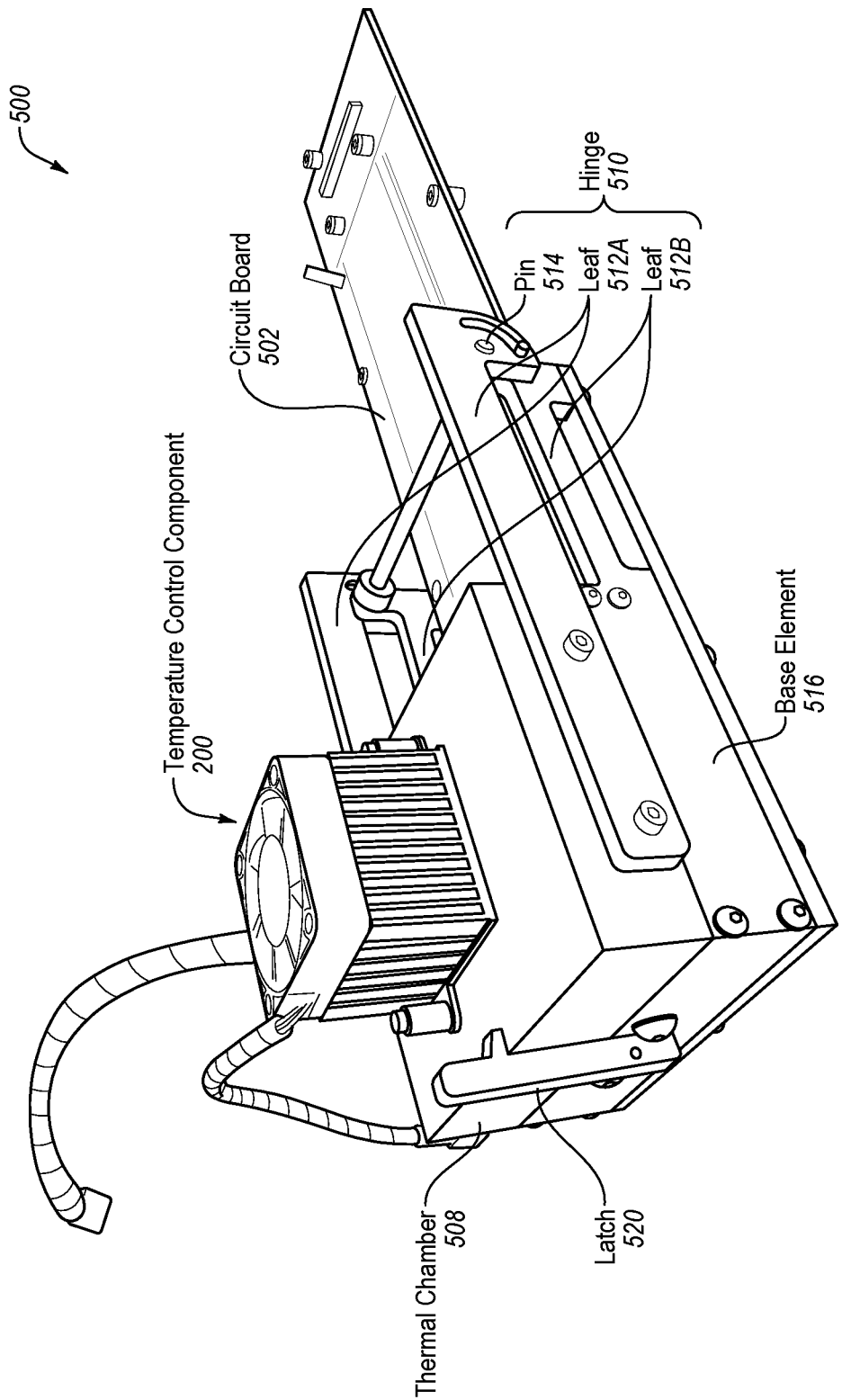

FIGS. 5A and 5B illustrate a system to test an electrical device under a variety of thermal conditions, in accordance with embodiments of the disclosure. It can be noted that a temperature control component, such as temperature control component 200 of FIGS. 2A-2B, can be used with or be part of system 500. It can also be noted that a thermal chamber, such as thermal chamber 300 of FIG. 3, can be used with or be part of system 500. Elements of temperature control component 200 of FIGS. 2A-2B and thermal chamber 300 of FIG. 3 are used to help illustrate aspects of FIG. 5. System 500 can be similar to system 400 as described with respect to FIGS. 4A-4B. System 500 can be used to test one or more electrical devices, such as electrical device 504, under a variety of thermal conditions as described herein. In FIG. 5A, system 500 is shown in an open position. In FIG. 5B, system 500 is shown in a closed position.

System 500 includes a temperature control component 200 mounted to a thermal chamber 508. Thermal chamber 508 illustrates a port for a single temperature control component 200, for purpose of illustration rather than limitation. In other embodiments, thermal chamber 508 can include any number of ports and any number of temperature control components 200. In some embodiments, system 500 includes a circuit board 502. Electrical device 504 is coupled to the circuit board 502 via a socket 506.

In some embodiments, system 500 includes a hinge 510. The hinge 510 allows the thermal chamber 508 to easily be moved from an open position to a closed position, and vice versa. In the closed position, the bottom part of thermal chamber 508 is aligned to contact the package of electrical device 504. Hinge 510 can include leaf 512A and leaf 512B. Leaf 512A connects the chamber to pin 514. Leaf 512B connects the circuit board 502 to the pin 514. The axis of rotation of the hinge 510 is defined by pin 514. It can be noted that hinges with different configurations can be used.

In embodiments, system 500 includes a base element 516. Thermal chamber 508 can couple to base element in the closed position. In some embodiments, base element 516 can be part of the thermal chamber 508. Latch 520 can be used to secure thermal chamber 508 in the closed position. In embodiments, the base element 516 includes a gas fitting 518 coupled to the gas port. As noted above, a gas source can be coupled to the gas fitting to maintain a positive pressure environment within thermal chamber 508.

Figure 6:
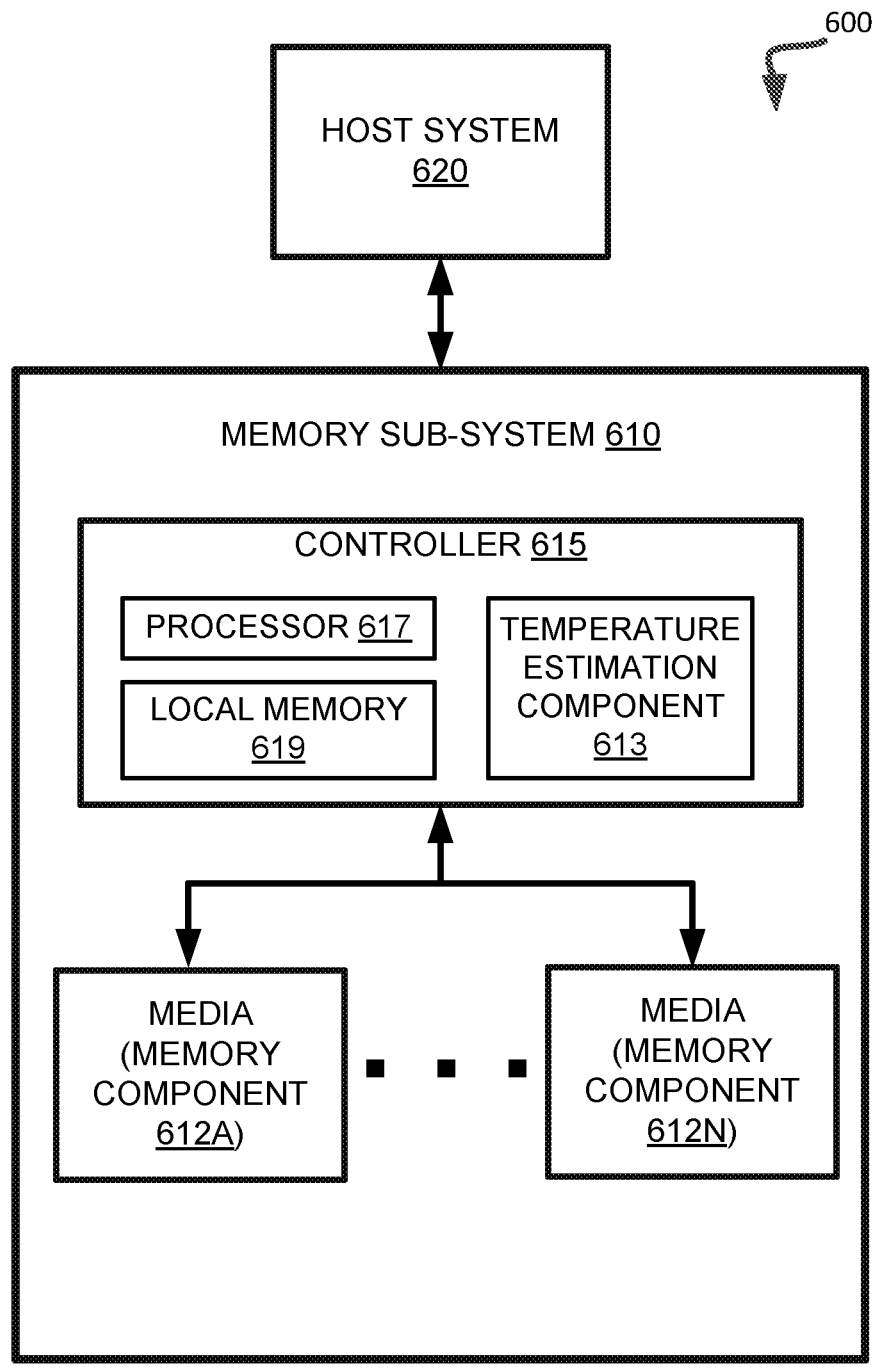
FIG. 6 illustrates an example computing environment that includes a memory sub-system, in accordance with some embodiments of the disclosure.

FIG. 6 illustrates an example computing environment 600 that includes a memory sub-system 610 in accordance with some embodiments of the disclosure. The memory sub-system 610 can include media, such as memory components 612A to 612N. The memory components 612A to 612N can be volatile memory components, non-volatile memory components, or a combination of such. In some embodiments, the memory sub-system is a storage system. An example of a storage system is a SSD. In some embodiments, the memory sub-system 610 is a hybrid memory/storage sub-system. In general, the computing environment 600 can include a host system 620 that uses the memory sub-system 610. For example, the host system 620 can write data to the memory sub-system 610 and read data from the memory sub-system 610.

The host system 620 can be a computing device such as a desktop computer, laptop computer, network server, mobile device, or such computing device that includes a memory and a processing device. The host system 620 can include or be coupled to the memory sub-system 610 so that the host system 620 can read data from or write data to the memory sub-system 610. The host system 620 can be coupled to the memory sub-system 610 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 620 and the memory sub-system 610. The host system 620 can further utilize an NVM Express (NVMe) interface to access the memory components 612A to 612N when the memory sub-system 610 is coupled with the host system 620 by the PCIe interface. The physical host interface can provide an interface for passing control, address, data, and other signals between the memory sub-system 610 and the host system 620.

The memory components 612A to 612N can include any combination of the different types of non-volatile memory components and/or volatile memory components. An example of non-volatile memory components includes a negative-and (NAND) type flash memory. Each of the memory components 612A to 612N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 620. Although non-volatile memory components such as NAND type flash memory are described, the memory components 612A to 612N can be based on any other type of memory such as a volatile memory. In some embodiments, the memory components 612A to 612N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 612A to 612N can be grouped as a group of memory cells, wordlines, wordline groups (e.g., multiple wordlines in a group), or data blocks that can refer to a unit of the memory component used to store data.

The memory system controller 615 (hereinafter referred to as "controller") can communicate with the memory components 612A to 612N to perform operations such as reading data, writing data, or erasing data at the memory components 612A to 612N and other such operations. The controller 615 can include hardware such as one or more integrated circuits and/or discrete components, a buffer memory, or a combination thereof. The controller 615 can be a microcontroller, special purpose logic circuitry (e.g., a field programmable gate array (FPGA), an application specific integrated circuit (ASIC), etc.), or other suitable processor. The controller 615 can include a processor (e.g., processing device) 617 configured to execute instructions stored in local memory 619. In the illustrated example, the local memory 619 of the controller 615 includes an embedded memory configured to store instructions for performing various processes, operations, logic flows, and routines that control operation of the memory sub-system 610, including handling communications between the memory sub-system 610 and the host system 620. In some embodiments, the local memory 619 can include memory registers storing memory pointers, fetched data, etc. The local memory 619 can also include read-only memory (ROM) for storing micro-code. While the example memory sub-system 610 in FIG. 6 has been illustrated as including the controller 615, in another embodiment of the disclosure, a memory sub-system 610 cannot include a controller 615, and can instead rely upon external control (e.g., provided by an external host, or by a processor or controller separate from the memory sub-system).

In general, the controller 615 can receive commands or operations from the host system 620 and can convert the commands or operations into instructions or appropriate commands to achieve the desired access to the memory components 612A to 612N. The controller 615 can be responsible for other operations such as wear leveling operations, garbage collection operations, error detection and error-correcting code (ECC) operations, encryption operations, caching operations, and address translations between a logical block address and a physical block address that are associated with the memory components 612A to 612N. The controller 615 can further include host interface circuitry to communicate with the host system 620 via the physical host interface. The host interface circuitry can convert the commands received from the host system into command instructions to access the memory components 612A to 612N as well as convert responses associated with the memory components 612A to 612N into information for the host system 620.

The memory sub-system 610 can also include additional circuitry or components that are not illustrated. In some embodiments, the memory sub-system 610 can include a cache or buffer (e.g., DRAM) and address circuitry (e.g., a row decoder and a column decoder) that can receive an address from the controller 615 and decode the address to access the memory components 612A to 612N.

The memory sub-system 610 includes a temperature estimation component 613 that performs operations as described herein. In some embodiments, the temperature estimation component 613 can be part of host system 620, controller 615, memory component 612N, an operating system, or an application. Temperature estimation component 613 can generate an estimated temperature for the memory sub-system 610. For example, the controller 615 can include a processor 617 (processing device) configured to execute instructions stored in local memory 619 for performing the operations described herein.

Figure 7:
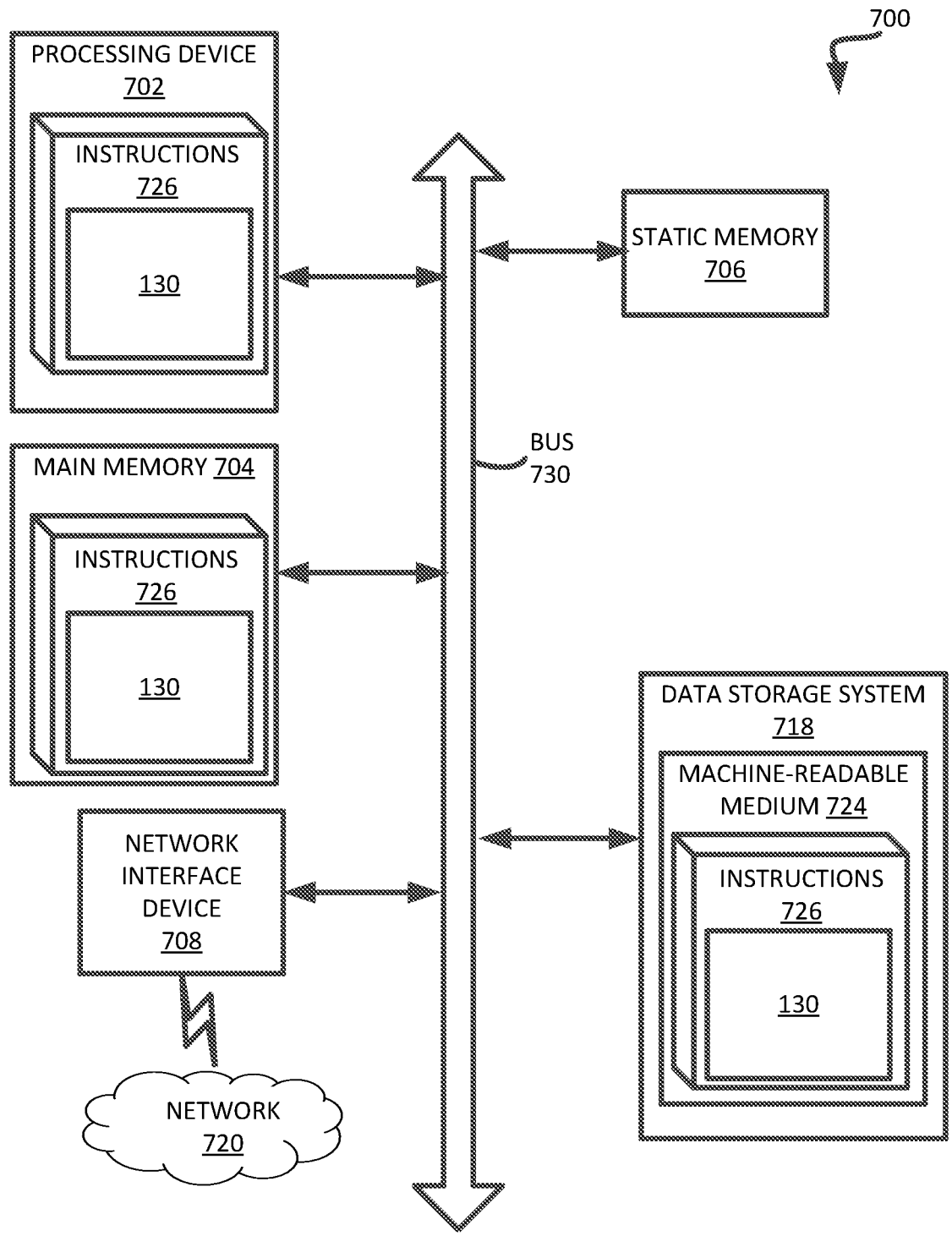
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host or server system that includes, is coupled to, or utilizes a test platform (e.g., to execute operations corresponding to the resource allocator component 130 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to a memory sub-system.

In one embodiment, the instructions 726 include instructions to implement functionality corresponding to a resource allocator component (e.g., the resource allocator component 130 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A thermal chamber comprising:
   a cavity that is enclosed by a plurality of sides;
   one or more ports that expose the cavity within the thermal chamber, wherein each of the one or more ports is configured to receive a temperature control component having a solid physical structure and configured to transfer thermal energy to and from an electrical device exposed via the cavity; and
   a bottom side open area of the thermal chamber located below the one or more ports, wherein the bottom side open area is configured to allow the temperature control component to contact the electrical device that is exposed via the bottom side open area.

2. The thermal chamber of claim 1, wherein the plurality of sides comprise a material that is a thermal insulator and non-conductive.

3. The thermal chamber of claim 1, wherein each of the one or more ports comprises opposing sides, the thermal chamber further comprising:
   a first securing feature located adjacent to a first side of the opposing sides of a first port of the one or more ports; and
   a second securing feature located adjacent to a second side of the opposing sides of the first port, wherein the first securing feature and the second securing feature to allow the temperature control component to be secured to a top side of the plurality of sides of the thermal chamber and align the temperature control component to contact the electrical device that is exposed via the bottom side open area.

4. The thermal chamber of claim 3, wherein the first securing feature and the second securing feature comprise holes through the top side of the thermal chamber, the first securing feature and the second securing features each configured to receive an adjustable coupling member to adjustably couple the temperature control component to the thermal chamber.

5. The thermal chamber of claim 1, further comprising:
   a gas port located at one of the plurality of sides, the gas port connecting an outer surface of the thermal chamber to the cavity.

6. The thermal chamber of claim 5, wherein the gas port comprises a hole located at one of the plurality of sides.

7. The thermal chamber of claim 6, further comprising:
   a gas fitting comprising a first end and a second end, wherein the first end of the gas fitting is to fit within the gas port.

8. The thermal chamber of claim 1, wherein the one or more ports comprise a plurality of ports aligned along a horizontal axis, wherein a bottom side of the plurality of sides comprises a single bottom side open area.

9. The thermal chamber of claim 1, further comprising:
   a plurality of mounting features located on at least one of a back side, a front side, a first end, or a second end of the plurality of sides, the plurality of mounting features configured to receive a mounting mechanism to mount the thermal chamber to a circuit board located under the thermal chamber.

10. The thermal chamber of claim 1, further comprising:
    a hinge comprising a first leaf, a second leaf, and a pin, wherein the pin defines an axis of rotation between the first leaf and the second leaf, wherein the first leaf is coupled to the thermal chamber and the second leaf is coupled to a circuit board.

11. A system to test an electrical device under a variety of thermal conditions, the system comprising:
    a circuit board;
    the electrical device coupled to the circuit board;
    a temperature control component having a solid physical structure and configured to contact the electrical device to transfer thermal energy to and from the electrical device; and
    a thermal chamber configured to be positioned above the circuit board, the thermal chamber comprising:
      a cavity that is enclosed by a plurality of sides; and
      one or more ports that expose the cavity within the thermal chamber, wherein each of the one or more ports is configured to receive the temperature control component to transfer thermal energy to and from the electrical device exposed via the cavity.

12. The system of claim 11, the thermal chamber further comprising:
    a bottom side open area of the thermal chamber located below the one or more ports, wherein the bottom side open area is configured to allow the temperature control component to contact the electrical device that is exposed via the bottom side open area.

13. The system of claim 11, wherein the thermal chamber further comprises:
    a back side of the plurality of sides, the back side orientated parallel to a horizontal axis;
    a front side of the plurality of sides, the front side orientated parallel to the horizontal axis;
    a first end of the plurality of sides, the first end orientated perpendicular to horizontal axis;
    a second end of the plurality of sides, the second end orientated perpendicular to the horizontal axis;
    a top side of the plurality of sides, the top side orientated perpendicular to and coupled to the back side, the front side, the first end, and the second end, and wherein the top side comprises the one or more ports orientated along a first direction of the horizontal axis, wherein each of the one or more ports comprises a top side open area that exposes the cavity within the thermal chamber, wherein each of the one or more ports is configured to receive the temperature control component; and
    a bottom side of the plurality or sides, the bottom side orientated parallel to the top side, wherein the top side open area of the one or more ports corresponds to a portion of a bottom side open area of the bottom side located directly below the top side open area.

14. The system of claim 13, wherein each of the one or more ports of the thermal chamber comprises opposing sides, the thermal chamber further comprising:
   a first securing feature located adjacent to a first side of the opposing sides of a first port of the one or more ports; and
   a second securing feature located adjacent to a second side of the opposing sides of the first port, wherein the first securing feature and the second securing feature to allow the temperature control component to be secured to the top side of the thermal chamber and align the temperature control component to contact the electrical device that is exposed via the bottom side open area.

15. The system of claim 14, further comprising:
   a plurality of adjustable coupling members to adjustably couple the temperature control component to the thermal chamber using via the first securing feature and the second securing feature.

16. The system of claim 15, wherein each of the plurality of adjustable coupling members comprise a spring element to adjustably couple the temperature control component to the thermal chamber.

17. The system of claim 15, wherein a top part of the temperature control component comprises a heat sink, wherein the heat sink is coupled to the top side of the thermal chamber using the plurality of adjustable coupling members.

18. The system of claim 13, the thermal chamber further comprising:
   a gas port located at one of the plurality of sides, the gas port connecting an outer surface of the thermal chamber to the cavity.

19. The system of claim 18, further comprising:
   a gas source coupled to the thermal chamber via the gas port, the gas source comprising one of oil-free air or nitrogen, wherein an application of the gas source to the thermal chamber to create a positive pressure environment within the cavity of the thermal chamber.

20. The system of claim 11, further comprising:
   an additional electrical device coupled to the circuit board; and
   an additional temperature control component to contact to the additional electrical device to transfer thermal energy to and from the additional electrical device, wherein a bottom part of the additional temperature control component extends within the cavity of the thermal chamber and contacts a package of the additional electrical device, wherein a temperature of the bottom part of the temperature control component and the bottom part of the additional temperature control component are independently controlled within a temperature range.

* * * * *